United States Patent

Wada

[11] Patent Number: 5,267,607
[45] Date of Patent: Dec. 7, 1993

[54] SUBSTRATE PROCESSING APPARATUS
[75] Inventor: Yuichi Wada, Kofu, Japan
[73] Assignee: Tokyo Electron Limited, Tokyo, Japan
[21] Appl. No.: 889,288
[22] Filed: May 28, 1992
[30] Foreign Application Priority Data
  May 28, 1991 [JP] Japan .................. 3-153885
  May 28, 1991 [JP] Japan .................. 3-153886
[51] Int. Cl.⁵ .................. F28F 7/00; H01L 21/324
[52] U.S. Cl. .................. 165/80.1; 165/80.5; 437/248; 118/724
[58] Field of Search .................. 165/80.1, 80.2, 80.4, 165/80.5; 118/724, 725; 269/20, 26; 437/248

[56] References Cited
U.S. PATENT DOCUMENTS

| | | | |
|---|---|---|---|
| 4,139,051 | 2/1979 | Jones et al. | 165/80.1 |
| 4,457,359 | 7/1984 | Holden | 165/80.3 |
| 4,512,391 | 4/1985 | Harra | 165/48.1 |
| 4,603,466 | 8/1986 | Morley | 165/80.5 |
| 4,671,204 | 6/1987 | Ballou | 165/80.4 |
| 4,743,570 | 5/1988 | Lamont, Jr. | 437/248 |
| 4,903,754 | 2/1990 | Hirscher et al. | 165/80.1 |
| 4,949,783 | 8/1990 | Lakios et al. | 165/80.1 |
| 4,999,320 | 3/1991 | Douglas | 437/248 |
| 5,033,538 | 7/1991 | Wagner et al. | 165/80.1 |
| 5,096,536 | 3/1992 | Cathey, Jr. | 118/724 |

Primary Examiner—John Rivell
Assistant Examiner—L. R. Leo
Attorney, Agent, or Firm—Oblon, Spivak, McClelland, Maier & Neustadt

[57] ABSTRACT

A magnetron sputtering apparatus having a heating susceptor in a vacuum chamber to support a wafer. The wafer is fixed on a ring-shaped projection by clamps at wafer-mounted section on the top of the susceptor. A substantially closed space is formed between the underside of the wafer and that face on the top of the susceptor which is defined by the wafer-mounted section to oppose the underside of the wafer. Ar gas which serves as heat-medium gas is supplied into the closed space, flowing into it from its peripheral area. The Ar gas is exhausted at the center of the closed space by a vacuum pump. Heat is transmitted from the susceptor of the wafer through the Ar gas to set the wafer at a certain temperature.

15 Claims, 7 Drawing Sheets

SUBSTRATE PROCESSING APPARATUS

BACKGROUND OF THE INVENTION

1. Field of the Invention

The present invention relates to an apparatus for processing a substrate in an atmospheric gas while controlling a substrate temperature and, more particularly, to an apparatus for processing a semiconductor wafer in the manufacturing process of a semiconductor device.

2. Description of the Related Art

Known as this type of processing apparatus are a sputtering apparatus and so on which are employed, for example, in the manufacturing process of a semiconductor device.

In the sputtering apparatus, in order to fully reduce the concentration of a remaining gas in a vacuum chamber, the interior of the vacuum chamber is set to a predetermined pressure by a vacuum pump with an exhaust conductance set at a maximal value through valve adjustment. Then with the exhaust conductance set to a smaller value, a sputter gas, such as an argon gas, is introduced into the vacuum chamber to reach a predetermined gas pressure. The sputtering gas is changed into a plasma in the neighborhood of a target to allow positive ions in the plasma to collide with the negative voltage-applied target. Through the collision, atoms, molecules, and so on are emitted from the target and the emitted atoms reach an opposed semiconductor wafer surface where a thin film is formed on the surface of the semiconductor wafer.

FIG. 1 is a cross sectional view diagrammatically showing one form of a susceptor of a conventional sputtering apparatus.

In FIG. 1, a semiconductor wafer 1 to be treated is placed on the surface of the susceptor 50 which is situated in a vacuum chamber (not shown) serving as a process chamber. The semiconductor wafer 1 is clamped by a clamp means on the surface of the susceptor. A thin film is formed, by sputtering, on the surface of the wafer 1 which is opposed to the target 2.

A negative voltage is applied to the target 2 placed on a target electrode 62 which is situated in an opposed relation to the semiconductor wafer. A sputtering gas (atmospheric gas) introduced into the vacuum chamber is changed into a plasma to allow those positive ions in the plasma to collide with the target.

In order to obtain a thin film of excellent characteristic on the wafer surface, control has to be made by heating the wafer so that a uniform film may be formed at a predetermined temperature. In the formation of a thin Al film on the wafer 1, for example it is usually necessary to set the wafer temperature to about 200° C. A heater 60 for heating the susceptor 50 is, therefore, provided in the sputtering apparatus. Since the wafer 1 usually has a fine, uneven pattern on its reverse surface, air voids are formed between the wafer 1 and the susceptor 50. The sputtering process is carried out in a vacuum chamber, the air voids are also placed under a vacuum condition. The temperature of the wafer 1 is difficult to control due to a fall in the heat exchange percentage between the wafer and the susceptor. A gas of a predetermined pressure is introduced at an area between the surface of the susceptor and the wafer through a inlet 58 provided at the center of the susceptor 50. In this case, the introduced gas serves as a heat-medium, heating the wafer at that area. One form of this technique is disclosed in U.S. Pat. No. 4,512,391 to Harra.

In order to accurately control the temperature of the wafer, it is necessary that the gas (hereinafter referred to as a heat-medium gas) in the air voids or space 56 between the surface of the susceptor 50 and the wafer 1 be maintained to a predetermined pressure so as to obtain a desired heat exchange characteristics.

In this case, it is unavoidable that the heat-medium gas filled in the space will leak into the vacuum chamber through gaps created between the wafer and the susceptor at the edge of the wafer. Conventionally, in order to maintain a predetermined gas pressure, an amount of leakage involved is refurnished. As the heat-medium gas, the use is made of an inert gas, such as an Ar gas, thereby minimizing a possible bad effect exerted on the process conditions even when a leakage occurs in the vacuum chamber.

With a recent high density integration of the semiconductor elements, it is necessary to enhance the characteristic of a thin film formed by the sputtering apparatus as well as the accuracy with which the film is formed. For this reason, an apparatus has been developed whereby sputtering is done with the use of a sputtering gas of a lower pressure.

However, the conventional sputtering apparatus has such a problem that, due to the external leakage of the heat-medium gas as set out above, the pressure of the sputtering gas cannot be maintained under desired low pressure process condition. The heat-medium gas pressure acting on the rear surface of the wafer is meaningless unless it is set to a certain level adequate to obtain the heat exchange characteristic. Therefore there is naturally a lower limit on the pressure level, even if it is desirable to use a still lower level from the standpoint of reducing a leakage into the vacuum chamber. On the other hand, if the pressure in the vacuum chamber is lower as required, a greater pressure difference is involved between the pressure in the vacuum chamber and the heat-medium gas pressure so that more heat-medium gas leaks into the vacuum chamber from the rear surface side of the wafer. Even where the pressure in the vacuum chamber is controlled to a low level, it is not possible to maintain it under desired low pressure process conditions due to a flow of the heat-medium gas therein.

For example, if a titanium nitride film is to be formed, an Ar/$N_2$ mixed gas is employed at a predetermined partial pressure ratio. Where a plurality of gases are mixed as a sputtering gas, a variation in the partial pressure ratio of a sputtering gas by the flow of the heat-medium gas therein cannot be disregarded as the pressure condition becomes lower.

Further, the heat-medium gas flowing into the vacuum chamber serves as a carrier gas flying about as a dust in the vacuum chamber, causing a fall in the yield of a product due to the contamination of the wafer 1.

Where the wafer is clamped on the susceptor 50 by, for example, a mechanical clamp, etc., having a spring mechanism, if a pressure acting on the rear surface of the wafer varies due to a leakage of the heat-medium gas, the wafer is oscillated due to a variation in the pressure of the gas and in the spring pressure. The oscillation of the wafer facilitates an increase in the leakage of the heat-medium gas on the rear side of the wafer. In this case, the heat-medium gas is sequentially refurnished so as to compensate for such a leakage. Through the repetition of the gas leakage and refurnishing of the gas, the heat-medium gas is pulsated with time, providing a hitch to performing a temperature control of the wafer with high accuracy.

Further, where a sputtering is carried out with the use of a reaction gas and the sputtering gas, the reaction gas, together with the sputtering gas is introduced into the vacuum chamber. The molecules in the reaction gas react with atoms released from the target upon sputtering so that a thin film is formed, as a reaction product, on the semiconductor wafer.

With the target formed by, for example, a titanium (Ti), it is possible to form a titanium nitride thin film over the semiconductor wafer with the use of a nitrogen ($N_2$) gas as a reaction gas.

With the use of the conventional sputtering apparatus, it is possible to continuously form, on the wafer, a thin film resulting from the reaction of those atoms/molecules released from the target as well as a thin film resulting from the reaction, with a reaction gas, of those atoms/molecules released from the target.

Where, for example a titanium thin film and titanium nitride thin film are continuously to be formed over the semiconductor wafer, then sputtering is conducted under an argon gas atmosphere with a titanium as a target to form a titanium thin film. Then sputtering is carried out through the introduction of the argon gas and nitrogen gas to form a titanium nitride thin film.

The titanium thin film and titanium nitride thin film over the semiconductor wafer are used as a barrier layer when aluminum interconnect lines over the semiconductor wafer are connected to corresponding silicon contacts. When an aluminum layer is formed directly on a silicon layer in an attempt to connect those aluminum interconnect layers to the corresponding silicon contacts, the silicon is precipitated in the aluminum interconnect layer, failing to achieve an adequate electrical connection. In order to avoid such an inconvenience, a titanium thin film is first formed as an intimate layer between the silicon and titanium nitride thin films, then a titanium nitride thin film is formed as a barrier layer over the titanium thin film, and then an aluminum layer is formed over the titanium nitride thin film.

Where, subsequent to continuously forming a titanium thin film and titanium nitride thin film over the semiconductor wafer, a titanium thin film is to be formed over the semiconductor wafer, it is necessary to, after the interior of the vacuum chamber has been subjected to a vacuum to reach a base pressure in the vacuum chamber, again introduce an argon gas in the chamber so as not to allow a nitrogen gas to remain in the vacuum chamber.

However, it takes long to subject the vacuum chamber to a vacuum and hence it takes a longer period of time to achieve a gas exchange and hence to form a thin film over the semiconductor wafer.

With a recent high integration density of a semiconductor element, there is a growing demand that the characteristic of a thin film formed by the sputtering apparatus, as well as the accuracy with which it is formed thereby, be improved. Therefore, there is sometimes the case where the sputtering is done under a lower gas pressure. When a titanium thin film and titanium nitride thin film are to be formed as a barrier layer upon the connection of the aluminum interconnect layers to the silicon contacts as set out above, it is required that the resistivity of the barrier layer be minimized. It is desired that, because the resistivity of the titanium nitride thin film is proportional to a gas pressure upon the formation of a thin film, control be so made as to obtain a minimum gas pressure within a range in which it is possible to obtain a titanium nitride. Where sputtering is conducted under a lower gas pressure, it is necessary that the level of a vacuum be made very high for a base pressure prior to the introduction of the gas. It, therefore, takes an increasingly longer period of time to form a vacuum.

In the conventional sputtering apparatus, a sputter material is deposited on the area beyond means for restricting the direction in which sputter particles fly about, that it, on the inner wall of the vacuum chamber. It has, therefore, sometimes not been possible to obtain an adequate degree of vacuum even if a vacuum is drawn to a high level in the vacuum chamber.

Where a thin film is to be formed by sputtering over the semiconductor wafer, those atoms and molecules released from the target are deposited not only on the wafer but also on the inner wall of the vaccum chamber. The film thus formed on the inner surface of the vacuum chamber has normally an uneven surface, absorbing a greater amount of gas in the vacuum chamber. The gas thus absorbed in the film is released little by little from the film surface upon forming a vacuum in the vacuum chamber, thus lowering the level of a vacuum in the vacuum chamber due to the presence of a resultant gas involved. If the interior of the vacuum chamber is formed to a high vacuum level, an extremely long period of time is required or it is virtually impossible to obtain an adequate degree of vacuum. In this condition, it may not be possible to perform sputtering at such a low vacuum level. Therefore it may not be possible to obtain a thin film of adequate characteristics.

SUMMARY OF THE INVENTION

It is a first object of the present invention to provide a processing apparatus which can control the temperature of a substrate to be processed and lower the leakage of a heat-medium gas into a processing chamber.

The second object of the present invention is to provide a sputtering apparatus which can make a process gas exchange in a vacuum chamber for a brief period of time, readily control a gas pressure at a local area between a wafer and a target, and conduct sputtering with the use of the process gas of adequately low pressure level.

According to a first aspect of the invention, there is provided an apparatus for processing a substrate, which is to be processed, in an atomospheric gas while controlling the temperature of the substrate comprising: a process chamber; a process chamber; a susceptor arranged in the process chamber to support the substrate; a substrate-mounted section formed on the top of the susceptor opposed to the underside of the substrate, the section being contacted with the underside of the substrate at the top thereof to form a substantially closed space between the underside of the substrate and the opposed face on the top of the susceptor when the substrate is mounted on the section; means for setting the temperature of the opposed face on the top of the susceptor; means for fixing the substrate against the top of the substrate-mounted section; means for supplying a heat-medium gas into the space between the underside of the substrate and the opposed face on the top of the susceptor; and means for exhausting the heat-medium gas from the space between the underside of the substrate and the opposed face on the top of the susceptor.

In the apparatus according to the first aspect of the invention, since the heat-medium gas is exhausted, it is possible to prevent the gas from leaking through the gap between the circumference of the substrate and the susceptor in which the flow resistance is high, or to reduce the leakage of the gas through this gap. Hence, even if the substrate is processed under low-pressure process conditions, these conditions will not be jeopardized, whereby the partial-pressure ratio of the mixture gas remain unchanged.

Since the heat-medium gas is prevented from leaking, no dust will rise in the process chamber, thus increasing the yield. In addition, since no pulsative motion of the gas occurs at the back of the substrates being processed, the temperature of the substrates can be controlled with high precision.

The apparatus according to the second aspect of the invention is of the type in which a substrate is set to be face the target within the vacuum container, and the particles sputtered from the target are guided by a shield ring to be deposited on the substrate. The apparatus is characterized in that a hollow cylindrical conductance ring is located outside the shield ring. The conductance ring is moved between a closing position where it surround a region in front of the substrate and an opening position where it no longer surrounds that region, thereby to vary the exhaust conductance within the shield ring.

The apparatus according to the third aspect of the invention is of the same type as the apparatus according to the second aspect. This apparatus is characterized in that one end of the shield ring extends to a position near the substrate and has an opening in its side, and that an exhaust conductance varying means is located in the opening of the shield ring.

In the apparatus according to the second aspect of the invention, the exhaust conductance in the shield ring is set at a small value by moving the conductance ring to the closing position. Hence, a desirable gas pressure is maintained locally within the shield ring only, whereas high vacuum is maintained outside the shield ring, by means of the vacuum pump. When sputtering is performed in this pressure condition, films are prevented from being formed on the inner surface of the vacuum chamber. To set the interior of the vacuum chamber at base pressure, the conductance ring is moved to the opening position, whereby the exhaust conductance in the shield ring becomes maximum. In this case, too, films are prevented from being formed on the inner surface of the vacuum chamber, and little out-gas is generated. Thus, the interior of the chamber is set at the base pressure to lower the concentration of the residual gas to a predetermined value, within so short a time that the throughput increases.

In the apparatus according to the third aspect of the invention, the shield ring and the conductance varying means located in the side of the ring serve to achieve the same advantages as the apparatus according to the second aspect accomplishes. More specifically, the exhaust conductance is set at maximum at the time of setting the base pressure, and then it is reduce over the period from the gas introduction to the end of sputtering. As a result, a desirable gas pressure is maintained locally within the shield ring only, and also the throughput increases.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
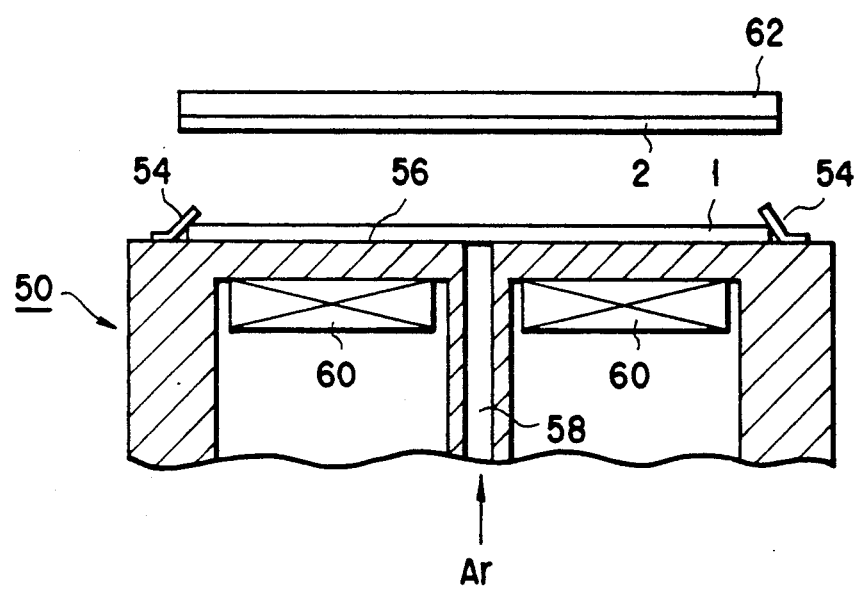
FIG. 1 schematically shows the susceptor and the wafer heating system of the conventional sputtering apparatus.
Figure 2:
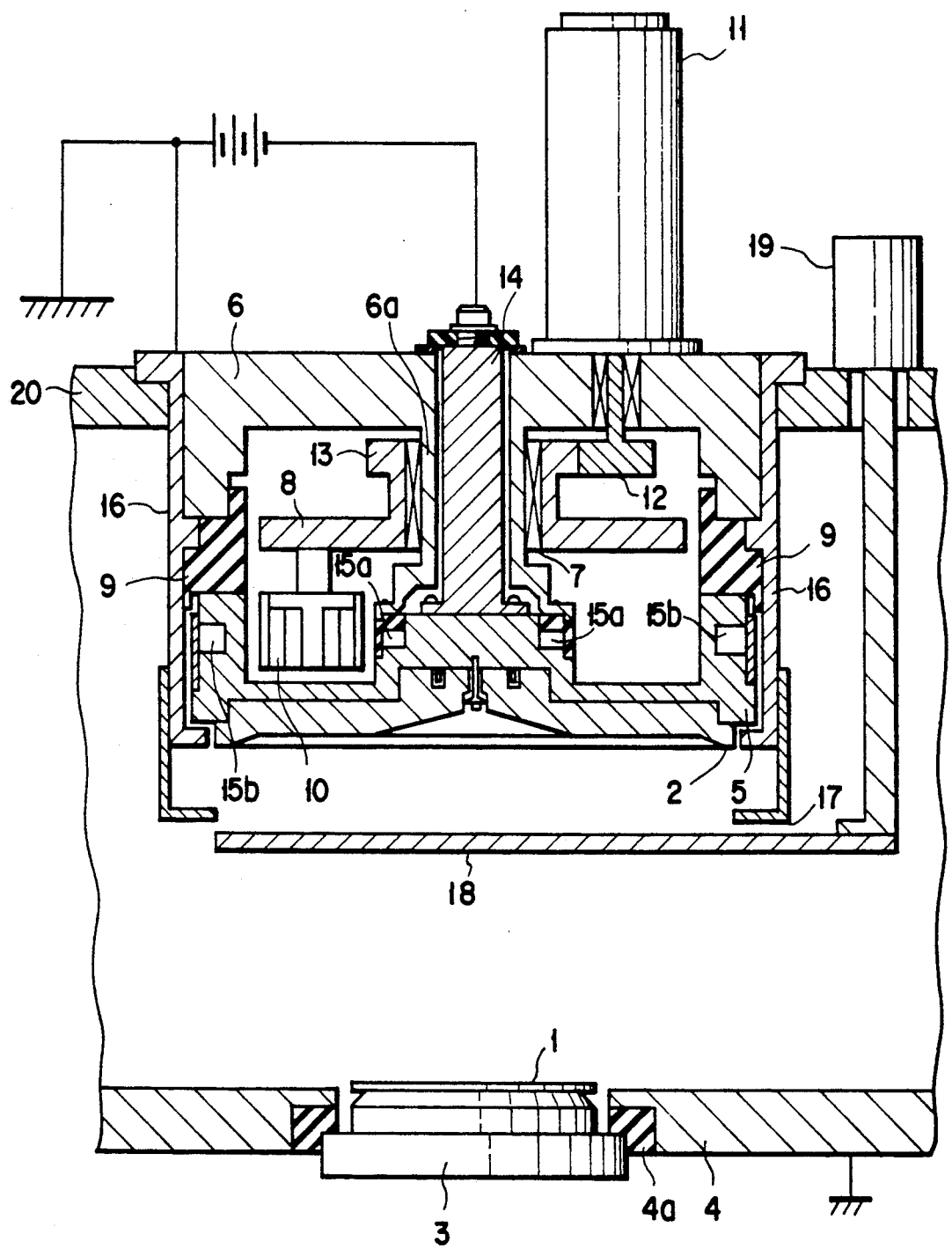
FIG. 2 is a front view, partly sectioned, showing the magnetron sputtering apparatus according to an embodiment of the present invention.

FIG. 2 is a front view, partly sectioned, showing the magnetron sputtering apparatus according to a first embodiment of the present invention.

A semiconductor wafer 1 is opposed to a target 2, which serves as a matter to be sputtered, in a vacuum chamber 20. The semiconductor wafer 1 is supported on a susceptor 3 which includes a wafer heating system. The susceptor 3 is attached to a base plate 4 of the vacuum chamber 20 through an insulating member 4a. The vacuum chamber 20 can be set highly reduced in pressure by a vacuum pump (represented by a reference numeral 22 in FIG. 8). The whole arrangement of the vacuum chamber 20 is substantially the same as that of the one shown in FIG. 8. FIG. 2, therefore, shows only a main portion of the tube.

The target 2 located above the wafer 1 is held by holder member 5. The material of which the target 2 is made is selected depending upon what thin film is to be formed on the wafer 1. Aluminium, silicon, tungsten, titanium, molybdenum, chrome, cobalt, nickel and others can be used as the material of the target 2 or of a thin film formed on the semiconductor wafer 1. Metal alloys of these elements can also be used. The materials such as sintered metals each having low heat conductivity can also be used if necessary. The target may be shaped like a disk, cone, rectangle, pyramid and others. It may also be shaped to have a stepped section.

A support 6 for supporting the holder member 5 and also supporting magnets 10 rotatably is located above the holder member 5. A hollow cylindrical portion 6a is projected downward from the support 6 at the center thereof. A bearing 7 is arranged round the cylindrical portion 6a and a disk 8 is supported, rotatably, by the bearing 7. The magnets 10 are fixed to the rotatably disk 8 at an eccentric position thereof.

A motor 11 for rotating the magnets 10 is fixed to the top of the support 6 and a first gear 12 is fixed to the output shaft of the motor 11. A second gear 13 is coaxially fixed to the rotatable disk 8 and it is engaged with the first gear 12. When the magnet drive motor 11 is rotated, therefore, its rotation output can be transmitted to the rotatable disk 8 through the first and second gears 12 and 13, to thereby rotate the magnets 10.

The holder member 5 serves to hold the target 2 and also serves as an electrode for applying negative DC voltage to the target 2. Further, it is designed to cool the target 2 held. For this purpose, it has a plurality cooling jackets 15a and 15b. It is cooled while circulating cooling medium such as cooling water through the cooling jackets 15a and 15b and its heat exchange with the target 2 prevents the temperature of the target 2 from rising when plasma is being generated. Furthermore, it is screw-fixed to the lower end of a current supply member 14 which is inserted into the cylindrical portion 6a of the support 6 and which is insulated from and supported by the support 6. Voltage supply to the target 2 is thus made possible.

A first shield ring 16 made of conductive metal and electrically insulated from the holder member 5 by an insulating member 9 is arranged around the holder member 5. An appropriate clearance of 2.5-3.5 mm, for example, is formed between the first shield ring 16 and the holder member 5 to stop discharge. A second shield ring 17, made of conductive metal, is attached to the first shield ring 16 to define the flying direction of particles sputtered from the target 2.

A shutter 18 is located facing an opening of the second shield ring 17 and it is swung by a drive system 19.

The target 2 serves as a cathode electrode when negative DC voltage is applied to it via the current supply member 14 and the holder member 5. To the contrary, the first and second shield rings 16 and 17, and the vacuum chamber 20 are earthed and they serve as an anode electrode. A voltage of 300-800V (or 15-30 kW) is usually applied between these electrodes. A sputtering gas is made into plasma in electric field formed between the target 2 and the shield rings 16, 17 and under pressure of 0.1-10 mm Torr, and positive ions in the plasma collide with the target 2. The susceptor 3 and the wafer 1 are held electrically floating. During this sputtering, however, potential of about $-20V$ is generated on the wafer surface.

Figure 3:
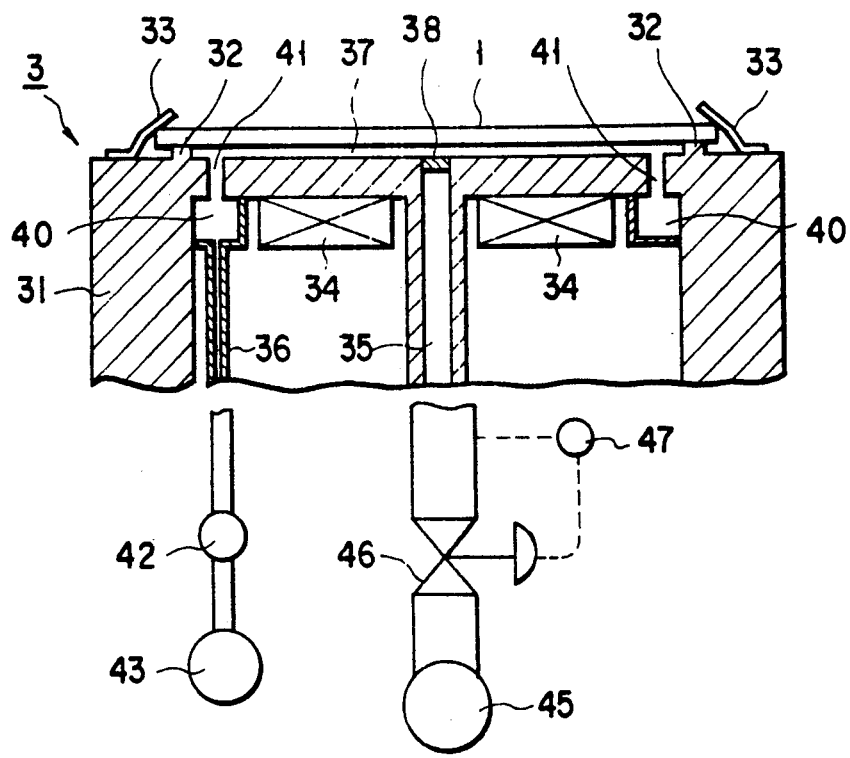
FIG. 3 schematically shows how the susceptor and the wafer heating system are arranged in the case of the sputtering apparatus shown in FIG. 2.

FIG. 3 is a sectional view schematically showing how the wafer heating system of the susceptor 3 is arranged.

The susceptor 3 has a support 31 on which the wafer 1 is mounted. Contacting the underside of the wafer 1 along the rim thereof, a ring-shaped gas sealing projection 32 is projected from that top of the support 31, on which the wafer 1 is mounted, so as to seal a clearance formed between the top of the support 31 and the wafer 1. The height of this gas sealing ring-shaped projection 32 may be made higher than that of the highest of convexes on the uneven underside of the wafer 1 and it has been made 0.16 mm in this case. The semiconductor wafer 1 is mounted on the gas sealing ring shaped projection 32 and fixed there by pressing force added by clamps 33.

A gas pipe 36 is provided in the support 31 to introduce a heat-medium gas into the clearance between the top of the support 31 and the wafer 1. A gas exhaust pipe 35 is also provided in the support 31 to exhaust the heat-medium gas introduced into the clearance.

Figure 4:
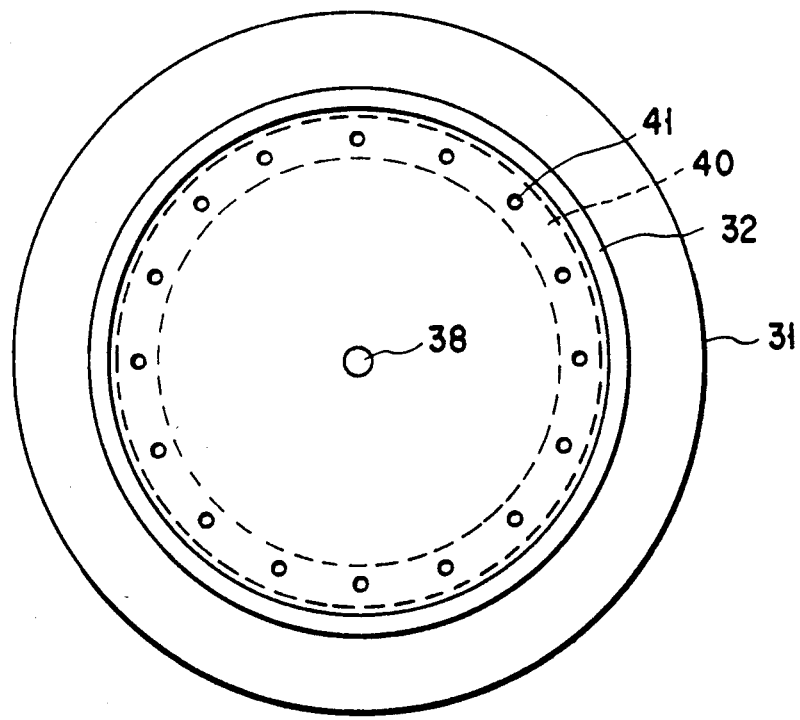
FIG. 4 is a plan showing the susceptor in FIG. 3.

The gas pipe 36 communicates with gas passage 40 arranged along the inner top corner of the support 31. The heat-medium gas introduced into the ring-shaped gas passage 40 through the gas pipe 36 is then introduced into the clearance 37 through a plurality of gas inlets 41 formed in the top of the support 31, extending and along the rim of the wafer 1, and communicating with the ring-shaped gas passage 40. In order to keep the wafer 1 uniform in temperature, it is preferable that the number of the gas inlets 41 formed at a certain interval is plural or 16, for example, as shown in FIG. 4. The gas pipe 36 is connected to a heat-medium gas source or Ar gas source 43, for example, through mass flow controller (MFC) 42.

That end of the gas exhaust pipe 35 which faces the clearance 37 is made open to collect the heat-medium gas in the clearance 37 at a position which corresponds to the center of the wafer 1. The other end of the gas exhaust pipe 35 is connected to a vacuum pump 45, variable in exhaust conductance, by which the heat-medium gas in the clearance 37 is exhausted through the gas exhaust pipe 35. A flow rate adjusting valve 46 is attached to the gas exhaust pipe 35, and is adjusted by a pressure controller (PRC) 47 which detects pressure on the side of the clearance 37.

Gas pressure in the clearance 37 between the top of the support 31 and the semiconductor wafer 1 may be set higher than such a pressure that enables desired heat exhausting characteristics to be guaranteed but lower than such a pressure that can keep the wafer 1, which is fixedly pressed by the clamps 33, not deformed. The gas pressure in this case has been set about 1-5 Torr, which is close to the lower limit of the above-mentioned gas pressure range. When the gas pressure is selected to be in the arrange of 1-5 Torr, a rotary pump can be used as the vaccum pump and it can also be used to reduce pressure in the chamber.

The heat-medium gas is not limited to a particular one. Ar gas has been therefore selected in this case.

A heater 34 is housed in the support 31. According to the wafer heating system of the present invention, therefore, the support 31 is heated by the heater 34 and heat exchange between the support 31 and the wafer 1 is conducted through the heat-medium gas. The wafer 1 is thus heated to adjust its temperature.

A metal-made mesh 38 is attached to the top of the gas exhaust pipe 35 and it is also heated by the heater 34. When both of the support 31 and the mesh 38 are made of metal excellent in heat conductivity, this heating of the mesh 38 can be achieved. When the mesh 38 is heated in this manner, that portion of the wafer 1 which faces the top of the gas exhaust pipe 35 can be heated.

A method of forming aluminum thin film on the wafer 1 will be described using the sputtering apparatus according to the first embodiment of the present invention.

The wafer 1 and the aluminium-made target 2 are set in the sputtering apparatus.

The vacuum chamber 20 in which the wafer 1 and the target 2 have been set is made vacuum roughly to $10^{-1}-10^{-3}$ Torr and then accurately to $10^{-5}-10^{-7}$ Torr.

The sputtering gas (or Ar gas in this case) is introduced into the vacuum chamber 20 to set gas pressure in the vacuum chamber 20 at $10^{-2}-10^{-3}$ Torr.

At the same time, heat-medium gas is introduced into the clearance between the top of the support 31 and the wafer 1, while the heater 34 start its heating. The top of the support 31 (or that face of the support 31 which is opposed to the wafer 1) is heated by the heater 34 and this heat of the support top is transmitted to the wafer 1 through the heat-medium gas in the clearance 37. The temperature of the wafer 1 is thus controlled. The heat-medium gas Ar is introduced firstly into the ring-shaped gas passage 40 through the gas pipe 36 and then into the clearance 37 at a certain flow rate through the gas inlets 41 which are formed in the top of the support 31 along the rim of the wafer 1.

It is preferable, for the above-mentioned reason, that the gas pressure in the clearance 37 is kept at 1-5 Torr. In order to keep the gas pressure at this value, the heat-medium gas Ar is introduced into the clearance 37 through the gas pipe 36 at a certain flow rate of 18 sccm, for example. At the same time, it is exhausted from the clearance 37 through the exhaust pipe 35 not to leak into the process chamber through fine gap between the wafer 1 and the gas sealing ring-shaped projection 32.

The reason why the heat-medium gas Ar is introduced into the clearance 37 and exhausted from it in this manner resides in that heat exchange is promoted by gas molecules which are under a certain pressure in the clearance 37. Therefore, the gas in the clearance 37 is caused to flow from the circumferential rim of the clearance 37 to the center thereof and this gas flow may be made at so low a speed as to prevent the gas from leaking into the process chamber through the above-mentioned gap. Conventionally, the clearance under the wafer 1 was so closed as to cause the gas to flow only to the gap, but when the gas is caused to flow to the exhaust pipe 35 because the pipe 35 has a flow resistance smaller enough than that of the gap, it can be prevented from leaking into the process chamber through the gap.

The gas sealing ring-shaped projection 32 is not essential, but when this projection 32 is provided, the flow resistance of the gas flowing to the exhaust pipe 35 can be made smaller enough than that of the gas flowing through the gap. In order to realize this prevention of gas leak, the flow rate of the heat-medium gas Ar has been made 18 sccm in this case. In addition, exhaust conductance is adjusted to keep the above-mentioned pressure in the clearance 37. The flow rate of the gas may be controlled either on gas supply or exhaust side or on both of them to keep the above-mentioned pressure in the clearance 37.

Heat exchange of the support 31 heated by the heater 34 with the wafer 1 can be thus promoted through the heat-medium gas filled under the certain pressure in the clearance 37, so that the semiconductor wafer 1 can be controlled to a desired temperature. Because aluminium has been used as the target 2 to form Al film on the wafer 1 in this case, it is preferable that the temperature of the wafer 1 is controlled to about 200° C.

When negative voltage is then applied to the target 2 through the current supply member 14 and the holder member 5, the sputtering gas is made into plasma in electric field generated between the target 2 and the shield rings 16, 17. When the magnet 10 is rotated on the underside of the target 2, a plasma ring in which the plasma has been confined by magnetic field can be formed. Particularly when the permanent magnets 10 are arranged as disclosed in Published Unexamined Japanese Patent Application No. 90-225664, magnetic lines of force spreading outside and inside the rotating radius direction of the magnets 10 can be formed and the plasma ring thus formed can be made larger than the contour of the magnets 10. When this plasma ring is formed, the rate at which the plasma is made into ions can be increased and the sputtering can be carried out at a certain erosion area on the sputtering face of the target 2.

In a case where the present invention is applied to the sputtering apparatus in which a film of titanium nitride is formed on the wafer 1, the heat-medium gas Ar can be prevented from leaking into the process chamber even when a mixed gas of Ar and $N_2$ each having a partial pressure rate is used as a process gas under low pressure. The process can be thus carried out, without adding any undesired influence to both of the low pressure and partial pressure rates.

Although the gas inlets 41 have been formed in the support 31 along the outer rim of the wafer 1 and the gas exhaust pipe 35 has been located in the center of the wafer 1 in this case, it may be arranged that the heat-medium gas is introduced into the clearance at the center of the wafer 1 and exhausted outside the clearance along the outer rim of the wafer 1.

Figure 5:
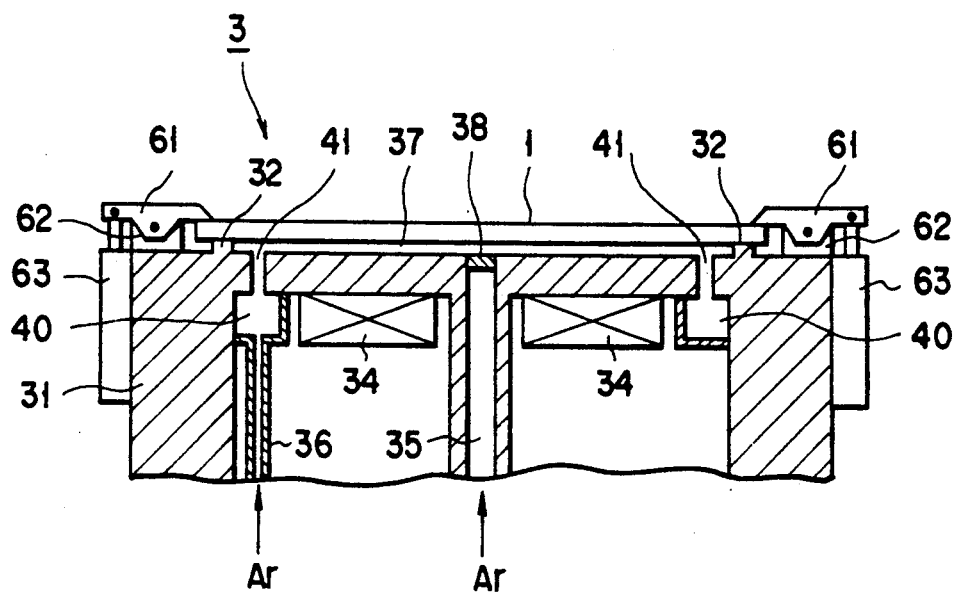
FIG. 5 schematically shows a variation of the susceptor in FIG. 3.
Figure 6:
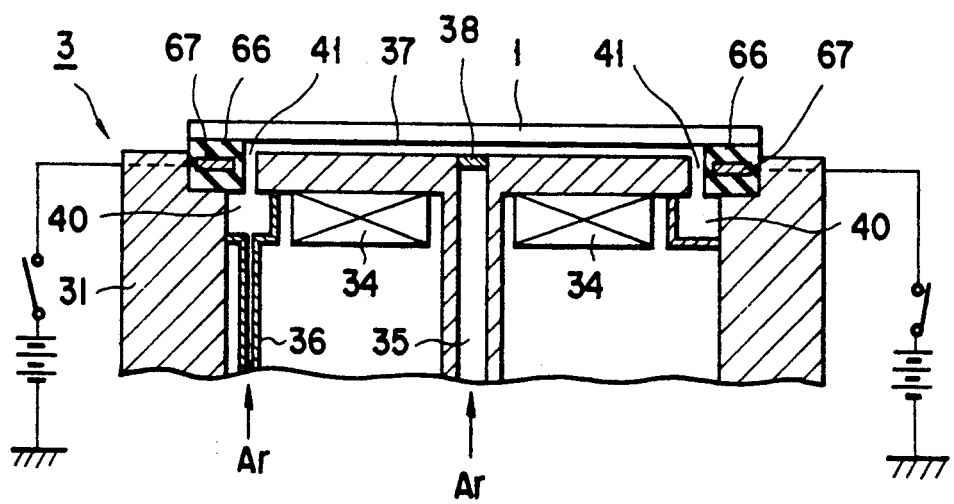
FIG. 6 schematically shows another variation of the susceptor in FIG. 3.

The same effects as in this case can be achieved even when the wafer is fixed by switching clamps, electrostatic chucks or other means instead of the fixing clamps 33. FIGS. 5 and 6 show variations of the fixing clamps 33, in which corresponding components as those in FIG. 3 will be denoted by the same reference numerals and description on these components will be omitted.

In the switching clamp means shown in FIG. 5, each of clamps 61 is pivoted on a support 62. Further, the clamps 61 is attached to a movable rod of an actuator 63 at the rear end thereof. Therefore, the clamps 61 can be driven open and closed by the actuators 63.

In the case of an electrostatic chuck means shown in FIG. 6, an insulator ring 66 is embedded on the top of the support 31 to form a mount on which the wafer is placed. An electrode 67 is further embedded in the insulator ring 66. The anode of a power source is connected to the electrode 67 to form the electrostatic chuck means.

Although the present invention has been applied to the sputtering apparatus in the case of the abovedescribed embodiment, it can be applied to CVD, etching and other processing apparatus. In the case of the etching apparatus in which objects to be processed must be cooled, the heaters 34 are replaced by coolers. The first embodiment of the present invention is intended to increase heat conductivity between the wafer and the susceptor by the heat-medium gas. Therefore, the heaters and the coolers are quite equivalent to each other as elements to determine the temperature of the wafer.

Figure 7:
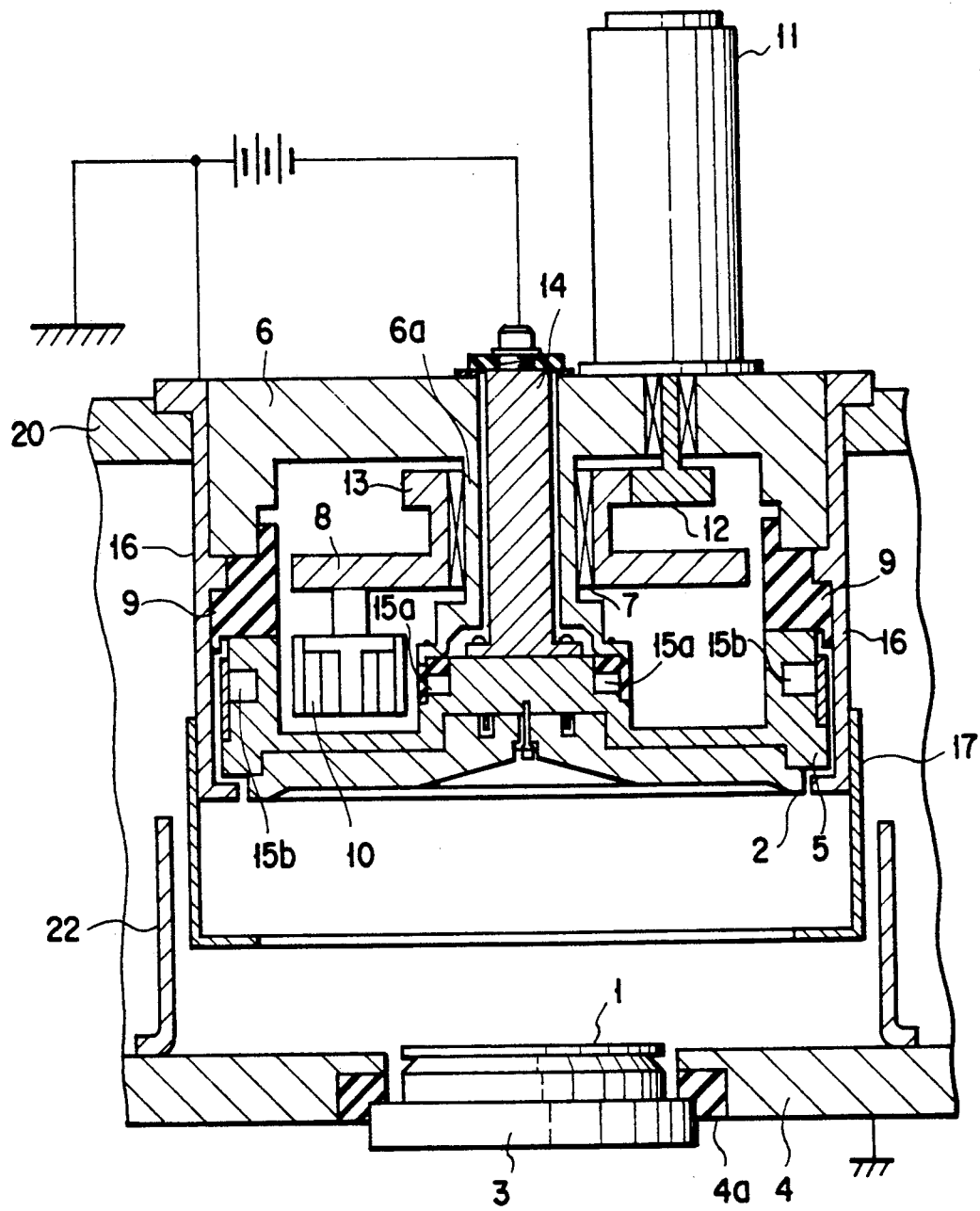
FIG. 7 is a front view, partly sectioned, showing the magnetron sputtering apparatus according to a second embodiment of the present invention.

FIG. 7 is a front view, partly sectioned, showing the magnetron sputtering apparatus according to a second embodiment of the present invention. This sputtering apparatus is fundamentally the same as the one shown in FIG. 2. Therefore, corresponding components as those in FIG. 2 will be represented by the same reference numerals, and description on these components will be omitted.

The second shield ring 17 which has served to define the flying direction of particles sputtered from the target and also served as an anode electrode is formed a little longer than the one shown in FIG. 2. In addition, a conductance ring 22 encloses the second shield ring 17 with an appropriate interval between them. The conductance ring 22 can be moved up and down along the second shield ring 17 by means which will be described later.

Figure 8:
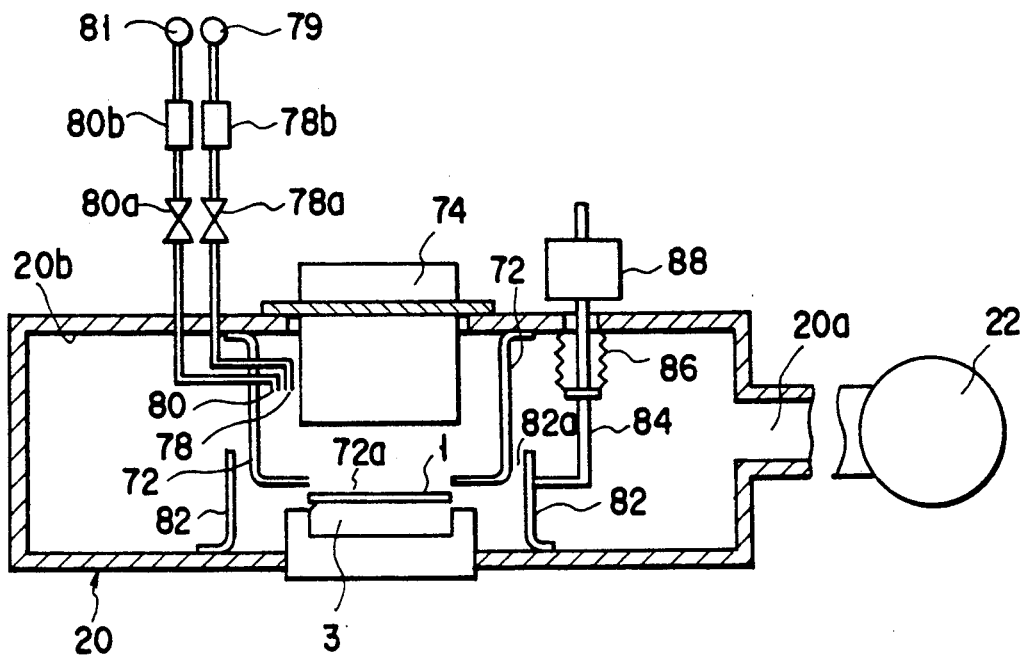
FIGS. 8 and 9 are front views, partly sectioned, showing characteristic of the sputtering apparatus in FIG. 7.

FIG. 8 is a front view, partly sectioned, schematically showing how characteristic of the second embodiment of the present invention is.

A cylindrical cover 72, which corresponds to the first and second shield rings 16 and 17 shown in FIG. 7, is located, enclosing the susceptor 3 and a sputtering source 74 which are opposed to each other, so as to define the flying direction of particles sputtered. The cover 72 is supported by a top 20b of the vacuum chamber 20. In addition, it has an opening 72a at the bottom thereof. This opening 72a of the cover 72 faces the wafer 1 and it allows atoms or molecules discharged from the target 2 to pass through it.

Sputtering and reaction gases supply pipes 78 and 80 are extended into the cover 72. The sputtering gas supply pipe 78 is communicated with a sputtering gas bomb 79 via a valve 78a and a mass flow controller 78b. Similarly, the reaction gas supply pipe 80 communicates with a reaction gas bomb 81 via a valve 80a and a mass flow controller 80b. Argon gas is used as the sputtering gas and nitrogen gas as the reaction gas in this second embodiment.

A cylindrical conductance ring 82 encloses the suscepter 3 and the cover 72. This conductance ring 82 can be moved up and down when a support arm 84 is driven. The support arm 84 extends outside the vacuum chamber 20, passing through a bellows 86, and it is connected to drive means outside the vacuum chamber 20. Therefore, the conductance ring 82 can be moved up and down by the drive means 88.

The vacuum chamber 20 is communicated with a vacuum pump 22 through an exhaust opening 20a formed at one side of the chamber 20. The vacuum chamber 20 is made vacuum by the vacuum pump 22.

FIG. 8 shows the conductance ring 82 lowered to the lowermost or closed. When the conductance ring 82 is under this state, the exhaust conductance of the cover 72 is the smallest. When the vacuum chamber 20 is made vacuum under this state, the gases in the cover 72 flow out through the opening 72a, pass through a gap 82a between the side wall of the cover 72 and the conductance ring 82, and reach the exhaust opening 20a. They are then exhausted outside the vacuum chamber 20 through the exhaust opening 20a.

Figure 9:
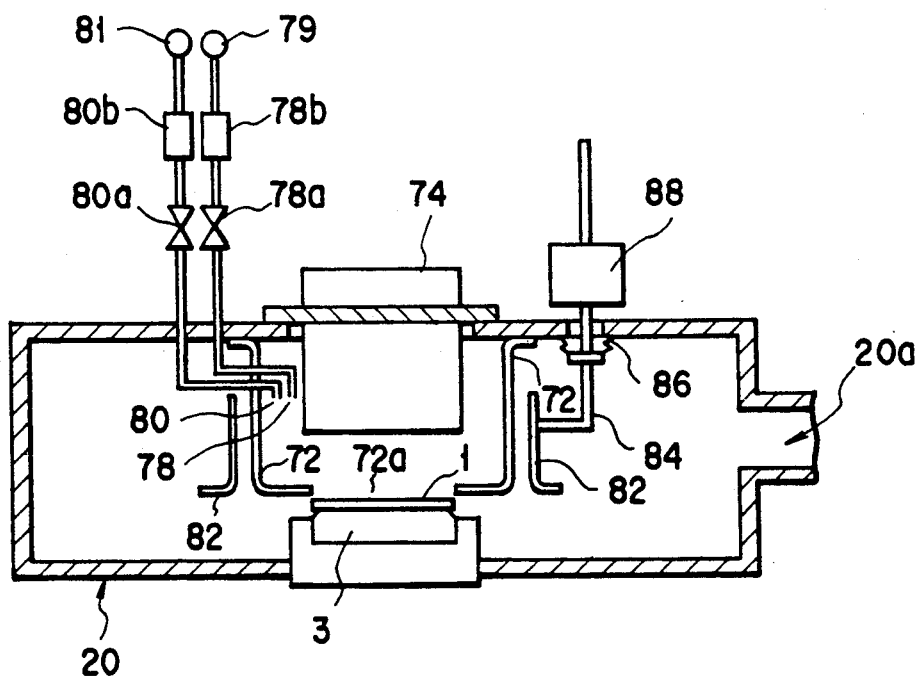

FIG. 9 shows the conductance ring lifted to the uppermost or opened. The exhaust conductance of the cover 72 is the largest under this state. When the lower end of the conductance ring 82 is lifted substantially the same in height as the bottom of the cover 72 as shown in FIG. 9, the exhaust conductance of the cover 72 becomes the largest.

According to the sputtering apparatus arranged as described above, the smallest value of the exhaust conductance is determined by the width of the gap 82a between the side wall of the cover 72 and the conductance ring 82 and also by how much the conductance ring 82 overlaps the cover 72. Therefore, design values relating to the gap 82a and others are determined according what aims and what kinds of conditions the apparatus is used to meet. In the case of this second sputtering apparatus, the exhaust conductance is not made zero even when the conductance ring 82 is kept the highest. It is therefore negligible even if the gases leak a little through the contacted portion of the cover 72 with the top 20b of the vacuum chamber 20, and through that of the conductance ring 82 with the base plate 4 of the vacuum chamber 20 when the conductance ring 82 is lowered to the lowermost.

It will be described how titanium and titanium nitride thin films are successively formed on the wafer 1 by the second magnetron sputtering apparatus.

1. The wafer 1 and the titanium-made target 2 are set in the sputtering apparatus The wafer 1 is then heated by the wafer heating system in the susceptor 3 which has been described in the first embodiment of the present invention. The conductance ring 82 is shifted to such a condition that makes its exhaust conductance the largest. In short, it is made as shown in FIG. 9.

2. The vacuum chamber 20 is made vacuum roughly to $10^{-1} - 10^{-3}$ Torr and then accurately to $10^{-5} - 10^{-7}$ by the vacuum pump 22.

3. The conductance ring 82 is lowered, as shown in FIG. 8, so as to make its exhaust conductance the smallest.

4. The sputtering gas (or Ar gas in this case) is introduced into the cover 72 through the sputtering gas supply pipe 78 to set gas pressure in the cover 72 a predetermined value. This set value of gas pressure is made different, depending upon various kinds of conditions such as the shape of the target 2, but it is usually in a range of 2-3 Torr.

The vacuum chamber 20 is still made vacuum by the vacuum pump 22. The sputtering gas in the cover 72 is therefore exhausted at a certain speed (or about 50 is 1/s) through the gap 82a between the side wall of the cover 72 and the conductance ring 82.

5. A negative voltage is applied to the target 2 through the current supply member 14 and the holder member 5 (see FIG. 7). The sputtering gas in the cover 72 is thus made plasma. Positive ions in the plasma collide with the target and atoms and molecules are thus discharged from the target. Atoms discharged reach that surface of the wafer 1 which is opposed to the target 2, and a titanium thin film is thus formed on it. When the magnets 10 are rotated above the target 2 at the same time, a plasma ring in which the plasma has been confined by magnetic field can be formed to increase the sputtering efficiency.

6. When the forming of the titanium thin film is finished, the reaction gas (or nitrogen gas in this case) is introduced into the cover 72 through the reaction gas supply pipe 80. The nitrogen gas introduced into the vacuum chamber 20 at this time usually occupies 40-70% of argon gas and the pressure of the nitrogen gas is therefore set 1.5 Torr in the second embodiment.

7. When the partial pressure of the reaction gas reaches a desired value, a voltage is again applied to the target 2 to form a titanium nitride thin film on the titanium thin film formed on the wafer 1 at the above step 5.

8. When the forming of the titanium nitride thin film is finished, the supply of gases through the pipes 78 and 80 is stopped. The conductance ring 82 is lifted to such the position as shown in FIG. 9 and the gases in the cover 72 are exhausted outside the vacuum chamber 20 to set the chamber 20 at certain base pressure.

When the above steps are repeated every wafer, the wafers can be continuously processed.

According to the second magnetron sputtering apparatus, the film forming on the wafer is carried out in the cover 72 while controlling the exhaust conductance by the conductance ring 82. This can prevent film from being formed on the inner wall of the vacuum chamber 20. In addition, the vacuum chamber 20 is usually kept at a high vacuum near the inner wall thereof. Therefore, the time during which the chamber is made vacuum to the base pressure after the sputtering process can be shortened to a greater extent.

Further, gas pressures of sputtering and reaction gases may be kept only locally in the cover 72 at the time of the sputtering process. Therefore, their control can become easier. Furthermore, the time during which the vacuum chamber 20 is made vacuum to the base pressure to made densities of gases remaining in the tube smaller that their predetermined values can be shortened as described above. Therefore, the pressure in the tube can be more easily set so low as to enable the barrier capacity of particularly the titanium nitride film to be enhanced.

Still further, sputtering and reaction gases can be exhausted for a quite shorter time when the conductance ring 82 is lifted.

Figure 10:
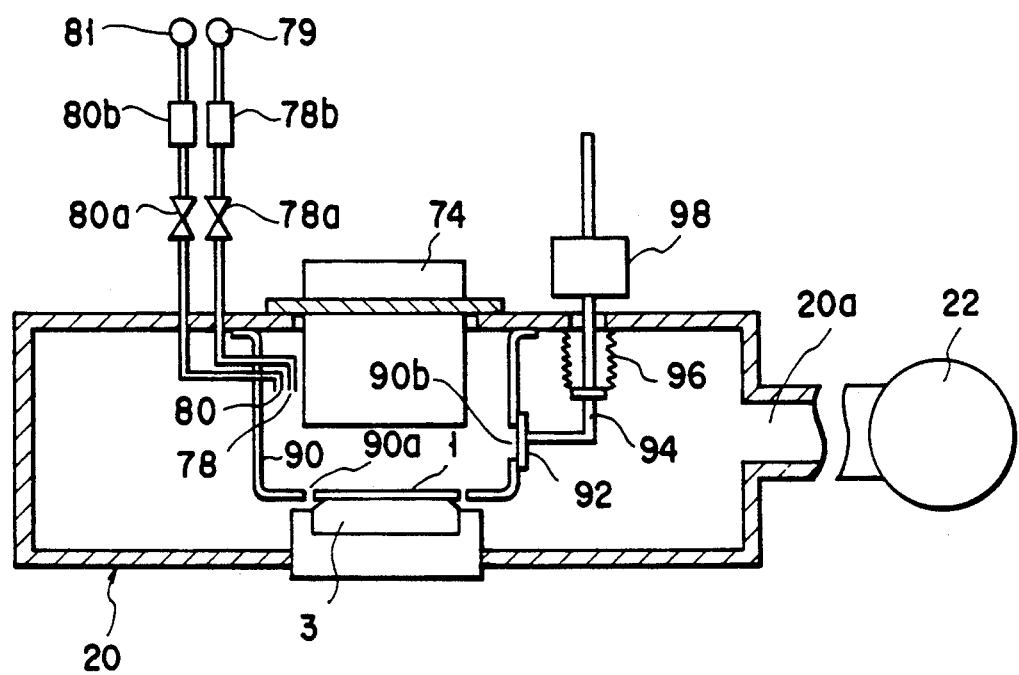
FIG. 10 is a front view, partly sectioned, showing characteristics of the sputtering apparatus according to a third embodiment of the present invention.

The magnetron sputtering apparatus according to a third embodiment of the present invention will be described with reference to FIG. 10. Corresponding components as those shown in FIGS. 7 through 9 will be denoted by the same reference numerals and description on these components will be omitted.

The third magnetron sputtering apparatus is different from the above-described second one in that cover 90 itself has a gas discharge switching means to control the exhaust conductance.

The cover 90 in the third sputtering apparatus extends almost to the wafer 1 mounted on the susceptor 3. It has an opening 90a at the bottom thereof, facing the wafer 1, and another opening 90b at the side thereof. A shutter 92 is provided to close or adjust the opening 90b. This shutter 92 can be moved along the opening 90b when a support arm 94 is driven. The support arm 94 extends outside the vacuum chamber 20 through a bellows 96 and it is connected to a drive means 98 outside the vacuum chamber 20. The shutter 92 can be thus moved by the drive means 98.

When the opening 90b of the cover 90 is fully closed by the shutter 92, the exhaust conductance of the cover 90 can be made the smallest. When the vacuum chamber 20 is made vacuum under this state, gases in the cover 90 reach the exhaust opening 20a, mainly through the opening 90a of the cover 90, and they are then exhaust outside the vacuum chamber 20. However, the exhaust conductance is not made zero because gases flow through the opening 90a.

When the shutter 92 is sufficiently separated from the opening 90a, the exhaust conductance of the cover 90 can be made the largest.

The third magnetron sputtering apparatus arranged as described above can be made simpler in construction than the second one. In addition, it has a smaller number of movable parts. This enables thin films to be formed under a condition in which particles are less generated by the smaller number of movable parts.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus for processing a substrate in an atmospheric gas while controlling a temperature of the substrate, comprising:
    a process chamber;
    a susceptor arranged in the process chamber to support the substrate;
    a substrate support formed in the susceptor and made of a material having an excellent heat conductivity;
    a recessed and opposed face formed on the support and opposed to a back surface of the substrate;
    an endless ring-shaped projection formed on the support and surrounding the opposed face, the opposed face and the projection being formed integrally of said material, the projection being formed only along an outer rim of the substrate and having an endless ring-shaped contact surface in contact with the back surface of the substrate to form a substantially closed space between the back surface of the substrate and the opposed face;
    a heater located behind and heating the opposed face;
    means for pushing the substrate against the contact surface;
    means for supplying a heat-medium gas into the space between the back surface of the substrate and the opposed face; and
    means for exhausting the heat-medium gas from the space between the back surface and the opposed face;
    wherein said means for supplying the heat-medium gas has a plurality of gas inlets formed at the opposed face along the outer rim of the substrate at a certain interval; and
    said means for exhausting the heat-medium gas has an exhaust opening formed at the center of the opposed face and a mesh made of metal having an excellent heat conductivity is attached to the exhaust opening.

2. The apparatus according to claim 1, wherein means for greatly reducing pressure in the chamber is connected to the process chamber.

3. The apparatus according to claim 1, wherein said means for exhausting the heat-medium gas includes means for detecting and controlling pressure in the space.

4. The apparatus according to claim 1, wherein said means for pushing the substrate includes clamps arranged along the projection.

5. The apparatus according to claim 1, wherein said means for supplying the heat-medium gas includes a means for adjusting the flow rate of the gas.

6. The apparatus according to claim 1, wherein said means for supplying the heat-medium gas includes an Ar gas source.

7. The apparatus according to claim 1, wherein the support is made of a metal.

8. The apparatus according to claim 1, wherein the heater heats the opposed face such that the substrate is heated to at least to 200° C.

9. A wafer sputtering apparatus comprising:
    a process chamber;
    means for greatly reducing pressure in the process chamber;
    a sputtering target arranged in the process chamber;
    an electrode arranged in the process chamber;

means for supplying a voltage between the target and the electrode;

means for supplying into the process chamber a gas to be transformed into plasma;

a susceptor arranged in the process chamber to support a wafer;

a wafer support formed on the susceptor and made of a material having an excellent heat conductivity;

a recessed and opposed face formed on the support and opposed to a back surface of the wafer;

an endless ring-shaped projection formed on the support and surrounding the opposed face, the opposed face and the projection being formed integrally of said material, the projection being formed only along an outer rim of the wafer and having an endless ring-shaped contact surface in contact with the back surface of the wafer to form a substantially closed space between the back surface of the wafer and the opposed face;

a heater located behind and heating the opposed face;

means for pushing the wafer against the contact surface;

means for supplying a heat-medium gas into the space between the back surface of the wafer and the opposed face; and means for exhausting the heat-medium gas from the space between the back surface and the opposed face;

wherein said means for supplying the heat-medium gas has a plurality of gas inlets formed at the opposed face along the outer rim of the wafer at a certain interval; and said means for exhausting the heat-medium gas has an exhaust opening formed at the center of the opposed face and a mesh made of metal having an excellent heat conductivity is attached to the exhaust opening.

10. The apparatus according to claim 9, wherein said means for exhausting the heat-medium gas includes means for detecting an controlling pressure in the space.

11. The apparatus according to claim 9, wherein said means for pushing the wafer includes clamps arranged along the projection.

12. The apparatus according to claim 9, wherein said means for supplying the heat-medium gas includes means for adjusting the flow rate of the gas.

13. The apparatus according to claim 9, wherein said means for supplying the heat-medium gas includes an Ar gas source.

14. The apparatus according to claim 9, wherein the support is made of a metal.

15. The apparatus according to claim 9, wherein the heater heats the opposed face such that the wafer is heated to at least 200° C.

* * * * *